United States Patent
Lin

(10) Patent No.: US 7,355,537 B2
(45) Date of Patent: Apr. 8, 2008

(54) BUILT-IN SELF-TEST APPARATUS AND METHOD FOR DIGITAL-TO-ANALOG CONVERTER

(75) Inventor: Chun Wei Lin, Changhua (CN)

(73) Assignee: Spirox Corporation, Hsinchu (TW)

( * ) Notice: Subject to any disclaimer, the term of this patent is extended or adjusted under 35 U.S.C. 154(b) by 776 days.

(21) Appl. No.: 10/910,342

(22) Filed: Aug. 4, 2004

(65) Prior Publication Data

US 2005/0035750 A1    Feb. 17, 2005

(30) Foreign Application Priority Data

Aug. 13, 2003    (CN) .............................. 92 1 22293

(51) Int. Cl.
*H03M 1/10* (2006.01)

(52) U.S. Cl. .................. 341/120; 341/118; 341/144; 324/76.15; 324/76.16; 324/76.24; 324/76.47; 324/76.48

(58) Field of Classification Search ................ 341/120
See application file for complete search history.

(56) References Cited

U.S. PATENT DOCUMENTS

| | | | | |
|---|---|---|---|---|
| 5,659,312 A * | 8/1997 | Sunter et al. | ................ | 341/120 |
| 6,339,388 B1 * | 1/2002 | Matsumoto | ................ | 341/120 |
| 6,492,798 B2 * | 12/2002 | Sunter | .................... | 324/76.15 |
| 6,703,820 B2 * | 3/2004 | Sunter | .................... | 324/76.15 |
| 6,987,472 B2 * | 1/2006 | Lin | ............................ | 341/120 |
| 2005/0068210 A1 * | 3/2005 | Lin | ............................ | 341/120 |

* cited by examiner

*Primary Examiner*—Khai M. Nguyen
(74) *Attorney, Agent, or Firm*—Volentine & Whitt, PLLC

(57) ABSTRACT

A built-in self-test apparatus for a digital-to-analog converter uses a differentiation unit for differentiating a digital-to-analog (DA) signal to obtain the differences between pulses of the analog signal. Next, the analog signal is converted into a digital signal in the light of a threshold voltage by a Schmitt trigger unit. Then, the duty cycles of the digital signal are calculated by a duty cycle retriever, and transmitted into a signature analyzer to calculate the differential non-linearity for error analysis. For processing a high-speed DA signal, the circuit disposed before the differentiation unit may use a test pattern unit, a sample-and-hold circuit and a logic circuit to lower the speed of the DA signal.

28 Claims, 15 Drawing Sheets

BUILT-IN SELF-TEST APPARATUS AND METHOD FOR DIGITAL-TO-ANALOG CONVERTER

BACKGROUND OF THE INVENTION (A) Field of the Invention

The present invention is related to a built-in self-test (BIST) apparatus and a BIST method, and more particularly to a BIST apparatus and a BIST method applied to a digital-to-analog converter (DAC).

(B) Description of the Related Art

Given the advancement of integrated circuits with high integration, more and more circuits are being integrated into a system-on-a-chip, SoC. Plenty of DACs, analog-to-digital converters (ADCs) and mixed-signal circuits with a combination of analog functions and digital functions are applied to fields like wireless communications, data conversion system, satellite communications, etc. Recent years see the development of BIST technology intended for the aforesaid circuits, wherein self-tests are directly conducted on hardware by built-in circuits in order to cut cost and shorten test duration.

The digital-to-analog (DA) voltage signals have been directly processed in the BIST for a DAC for years. However, it is difficult to distinguish analog signals from noise. Hence, despite their unsatisfactory benefit, additional auxiliary circuits or special methods have usually been used to facilitate the aforesaid data processing. Furthermore, the completion of the aforesaid data processing is a demanding job, for the reasons that, to process high-speed DA signals, not only an additional circuit for measuring voltage is needed, but also the sampling frequency of the DA signals should be more than two times the frequency of the DA signals themselves.

SUMMARY OF THE INVENTION

An objective of the present invention is to provide a BIST apparatus and a BIST method for a DAC, whereby errors between pulses of a signal are detected and analyzed to reduce technical difficulty in existing BIST, with a view to providing basis for circuit correction or testing specifications of a circuit.

To achieve the objective, the present invention discloses a BIST apparatus for a DAC. The BIST apparatus comprises a first low-pass filter (LPF), a differentiation unit, a second LPF, a Schmitt trigger unit, a duty cycle retriever and a signature analyzer. The first LPF is intended to smoothen an analog signal output from a DAC. The differentiation unit is connected to the output end of the first LPF to perform differentiation on the analog signal, so as to figure out errors between pulses of the analog signal. The second LPF is connected to the output end of the differentiation unit to smoothen the differentiated analog signal. The Schmitt trigger unit converts the analog signal output from the second low-pass filter into a digital signal in the light of a threshold voltage. The duty cycle retriever is intended to calculate the duty cycle of the digital signal. The signature analyzer is intended to analyze errors of the analog signal in accordance with the duty cycle.

According to the present invention, the BIST method for a DAC is implemented as the following steps. First, a digital signal is converted into an analog signal by a DAC. Second, the analog signal is smoothened for the first time to eliminate noise. Third, after first smoothening, differentiation is performed on the analog signal to figure out errors between pulses of the analog signal. Fourth, the analog signal is smoothened for the second time. Fifth, the analog signal is converted into a digital signal in the light of a threshold voltage, where the digital signal is equivalent to a high level "1" in response to whatever analog signal is greater than the threshold voltage or a low level "0" for whatever analog signal is less than the threshold voltage. Sixth, the duty cycles of the digital signal are calculated. Seventh, multiple differential non-linearity (DNL) are calculated in the light of the duty cycle, so as to figure out the errors of the analog signal.

For the application of high-speed DA signals, the devices disposed ahead of the differentiation unit can be substituted by another circuitry including a test pattern unit, a sample-and-hold circuit and a logic circuit, so as to slow down the speeds of the DA signals. The test pattern unit is intended to generate a test pattern including a plurality of bit signals that will be transmitted into the digital-to-analog converter, wherein each bit signal is an association of the bits of the same bit number of digital-to-analog (DA) signals for being tested, and is equal to zero between adjacent DA signals. The sample-and-hold circuit is used for sampling and holding the output signals of the DAC, so as to generate an incremental and continuous output signals that will be transmitted into the differentiation unit for processing. The logic circuit is used for providing control signals for the sample-and-hold circuit and the following circuits thereof.

The BIST method for a DAC processing high-speed DA signals is implemented as the steps (a)-(h). In step (a), a test pattern including a plurality of bit signals is generated, wherein the bit signal is an association of the bits of the same bit number of the DA signals for being tested. In step (b), the bit signals are converted into an analog signal. In step (c), the analog signal is performed sample-and-hold, wherein the pulses of the analog signal are sampled and the peak values of the pulses of the analog signal are held. In step (d), the analog signal performed sample-and-hold is differentiated to obtain the differences between the pulses thereof. In step (e), the analog signal is smoothened. In step (f), the analog signal is converted into a digital signal in the light of a threshold voltage. In step (g), a duty cycle of the digital signal is calculated. In step (h), an error of the analog signal is calculated based on the duty cycle.

In short, unlike known BIST circuits that process DA signals directly, the BIST method of the present invention involves calculating the differences between every two successive pulses of an analog signal by differentiation and converting the amplitudes of pulses expressed in terms of the differences into the duty cycles of a digital signal, with a view to analyzing errors between successive codes. The benefit is that the complexity and difficulty of BIST for a DAC are greatly reduced.

BRIEF DESCRIPTION OF THE DRAWINGS

The present invention will be described according to the appended drawings in which.

PREFERRED EMBODIMENT OF THE PRESENT INVENTION

Figure 1:
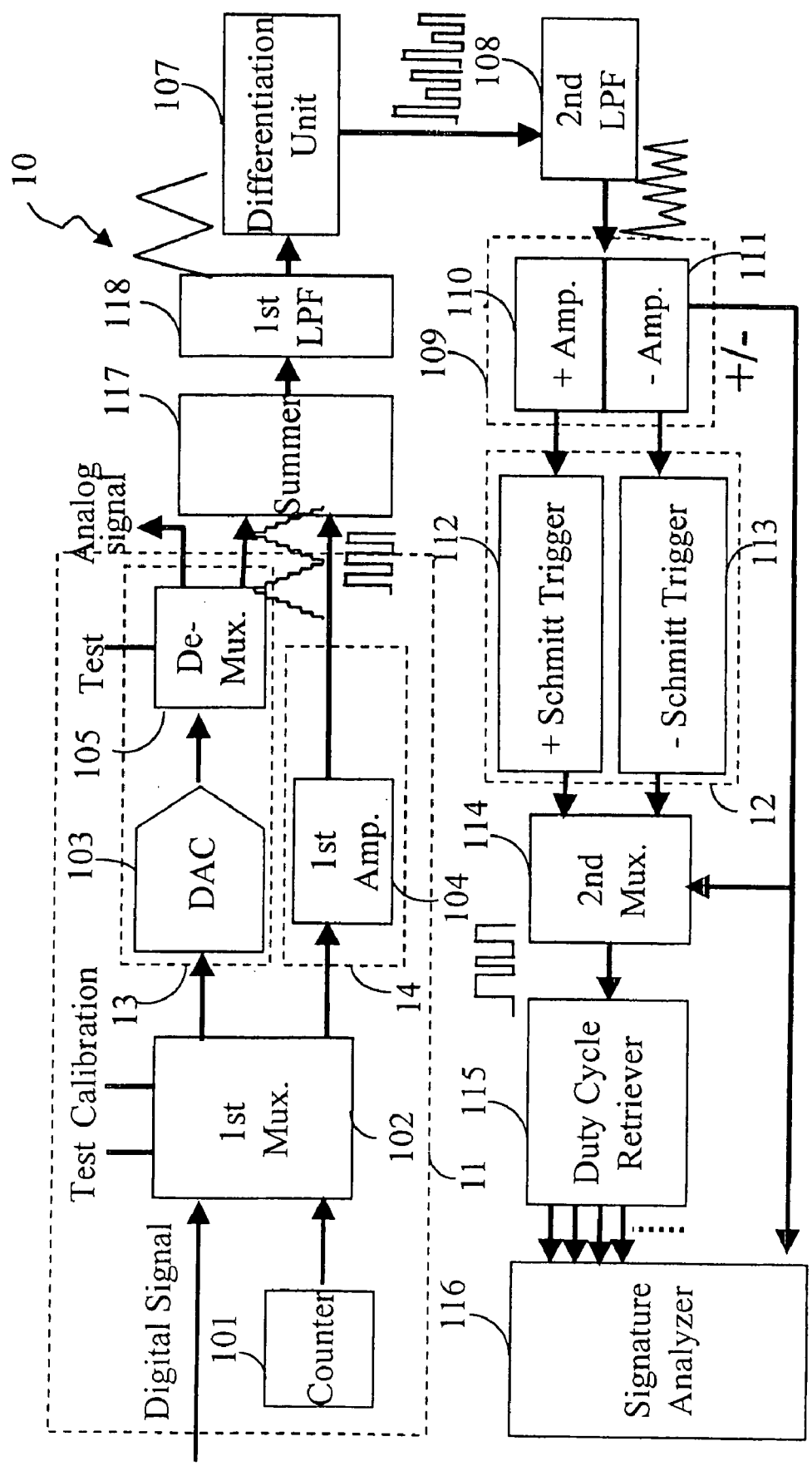
FIG. 1 illustrates a BIST apparatus applied to a DAC in accordance with the present invention.

FIG. 1 illustrates a BIST apparatus 10 in accordance with the present invention, which is intended to calibrate and test a DAC 103. The input end of the DAC 103 is connected to a first multiplexer 102 for selecting a digital signal or a signal output from a counter 101. In the case of 4-bit, the signals output from the counter 101 are "0000", "0001" . . . "1111" in sequence, and return from "1111" to "0000" in sequence. The output end of the first multiplexer 102 is connected to not only the DAC 103 but also a first amplifier 104 in parallel. A demultiplexer 105 receives the signals output from the DAC 103. An output end of the demultiplexer 105 can output normal analog signals, whereas the other output end is connected to an input end of a summer 117 for outputting signals during testing. The other input end of the summer 117 is connected to the output end of the first amplifier 104. The summer 117 is intended to calculate signals output from the demultiplexer 105 and the first amplifier 104. The output end of the summer 117 is connected to a first low-pass filter (LPF) 118 so as to smoothen the signals by integration. With a differentiation unit 107, differentiation is performed on signals output from the first LPF 118, so as to analyze the difference between individual pulses of a signal. The differentiation unit 107 can be a differentiator, a sample-and-hold circuit or a switching capacitor (SC). Afterwards, the signals are smoothened for the second time by a second LPF 108 before being sent to an amplification unit 109 for signal amplification. The amplification unit 109 comprises a positive amplifier 110 and a negative amplifier 111 for generating two amplified signals with opposite phases. The respective outputs of the positive amplifier 110 and the negative amplifier 111 are connected to a Schmitt trigger unit 12, a circuit linking a positive Schmitt trigger 112 and a negative Schmitt amplifier 113 in parallel, for converting the analog signals into digital signals, in which signals are classified as a high level "1" and a low level "0" in the light of a predetermined threshold voltage. The high level "1" is generated in response to whatever signal voltage is greater than the threshold voltage, and the low level "0" is generated for signal voltage less than the threshold voltage. On selection by a second multiplexer 114, the digital signals are sent to a duty cycle retriever 115 and a signature analyzer 116 for analyzing errors of the analog signals.

The circuit through which a signal is transmitted to the summer 117 is generalized as a signal selection circuit 11, which is intended to select and switch signal paths during calibration or testing. In other words, the signal selection circuit 11 comprises the counter 101, the first multiplexer 102, the DAC 103, the first amplifier 104, and the demultiplexer 105, where the DAC 103 and the demultiplexer 105 together form a testing circuit 13, and the first amplifier 104 functions as a calibration circuit 14; both circuits 13 and 14 are connected to the output ends of the first multiplexer 102 in parallel. A path is selected to transmit signals, depending on whether a command received by the first multiplexer 102 is "test" or "calibrate." Given the calibration function, the operations of a circuit are tested in order to check if they are normal. As to the testing function, analog signals converted from the DAC are tested to identify whether an abnormal error occurs.

While calibration is underway, a signal is transmitted through the first multiplexer 102, the first amplifier 104, the summer 117, the first LPF 118, the differentiation unit 107, the second LPF 108, the positive amplifier 110, the positive Schmitt trigger 112, the second multiplexer 114, the duty cycle retriever 115 and then the signature analyzer 116; meanwhile, the signal that the demultiplexer 105 inputs into the summer 117 is zero. On the other hand, while a testing is performed, a signal is transmitted through the first multiplexer 102, the DAC 103, the demultiplexer 105, the summer 117, the first LPF 118, the differentiation unit 107, the second LPF 108, the amplification unit 109, the Schmitt trigger unit 12, the second multiplexer 114, the duty cycle retriever 115 and the signature analyzer 116; meanwhile, the signal that the first amplifier 104 inputs into the summer 117 is zero. There are discrepancies between the two procedures. First, the way signals processed by the calibration circuit 14 is different from the way signals processed by the testing circuit 13. Second, during a testing, signals processed through the differentiation unit 107 may give rise to positive voltage signals and negative voltage signals, and thus it is necessary to process the signals by the positive amplifier 110 and the negative amplifier 111 that are connected in parallel, as well as the positive Schmitt trigger 112 and the negative Schmitt trigger 113. As regards a calibration procedure, one-by-one signal pulses output from the differentiation unit 107 increase by one unit, so no signal of negative voltage is generated.

As shown in FIG. 1, signal waveforms are roughly depicted near the outputs of the demultiplexer 105, the first LPF 118, the differentiation unit 107, the second LPF 108 and the second multiplexer 114, respectively, revealing how the individual circuit components affect the signal waveforms.

Figure 2:
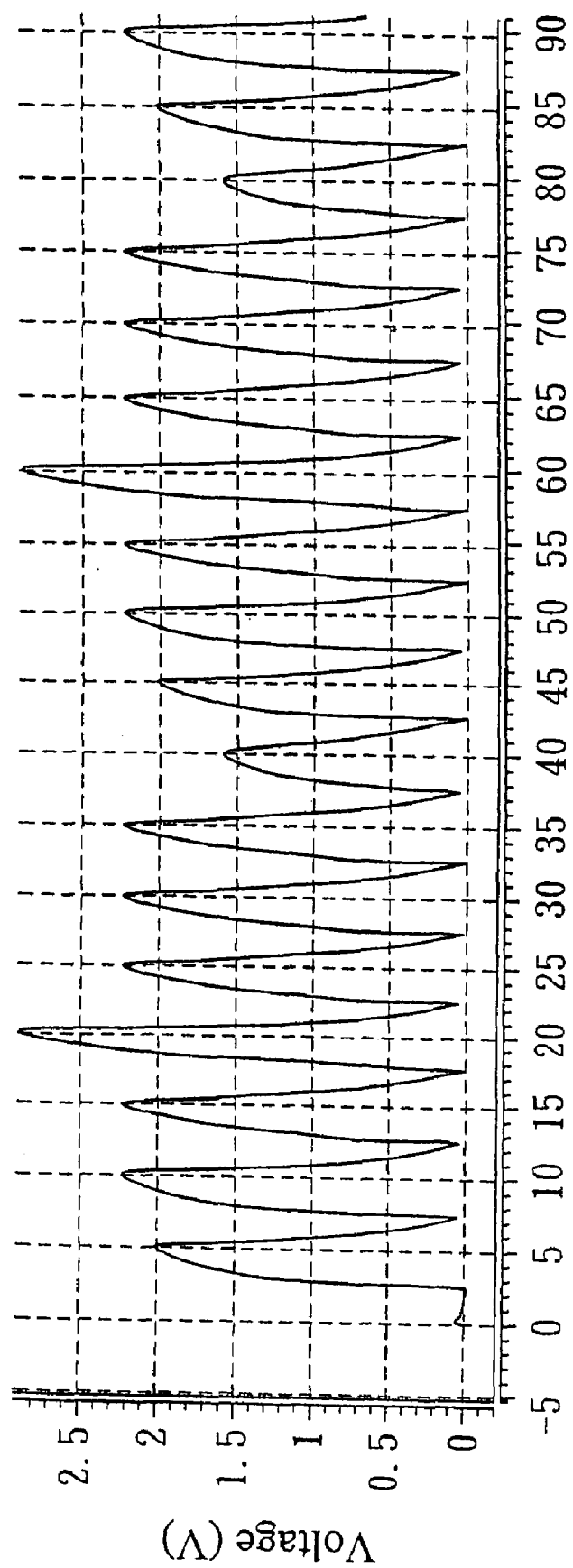
FIG. 2 exemplifies the waveforms of the signals subjected to differentiation and smoothening enabled by a BIST apparatus in accordance with the present invention.

FIG. 2 exemplifies a signal output from the second LPF 108, wherein the x-coordinate represents time, and the unit is nano-second (ns), whereas the y-coordinate represents voltage, and the unit is volt (V). As shown in FIG. 2, pulses of various amplitudes are generated after the signal is differentiated and smoothened.

Figure 3:
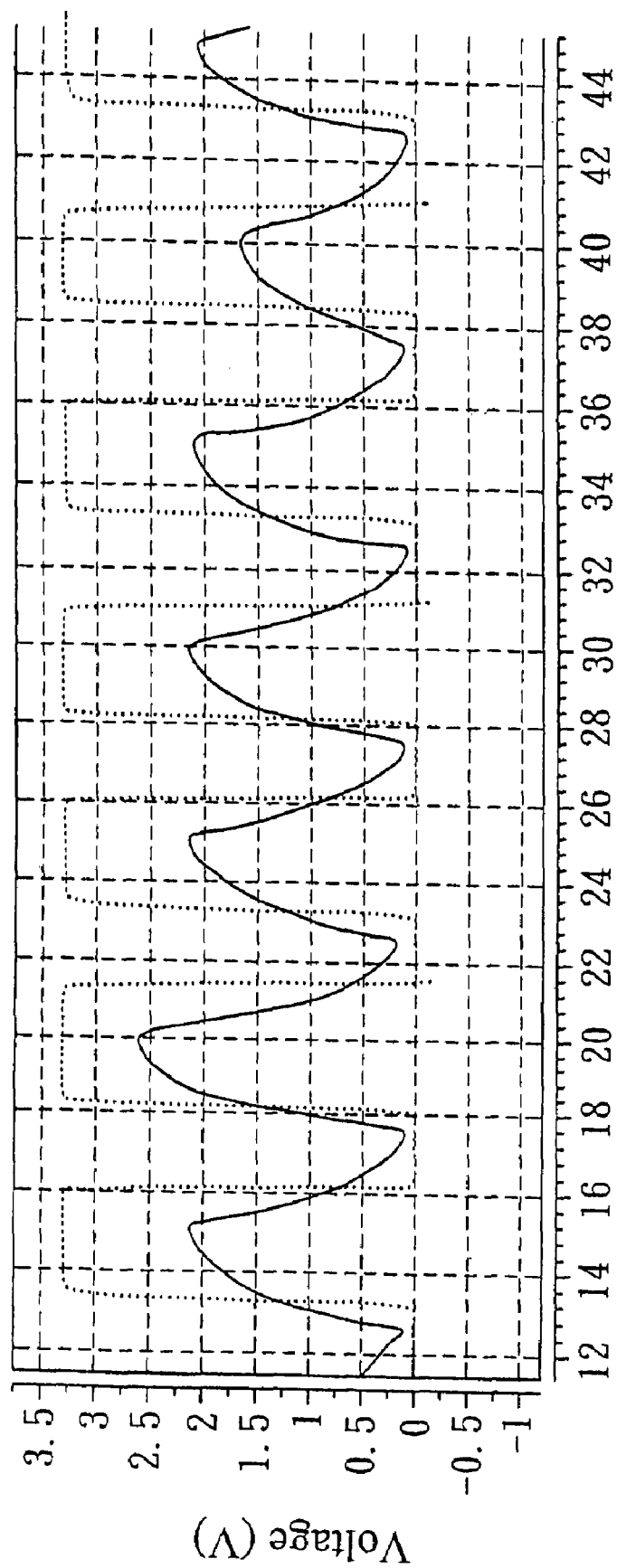
FIG. 3 illustrates the signal conversion carried out by the Schmitt trigger unit of a BIST apparatus in accordance with the present invention.

FIG. 3 illustrates the function of the Schmitt trigger unit 12, wherein the solid line and the dotted line denote the signal waveforms before and after the Schmitt trigger unit 12, respectively. If a signal of a greater amplitude is digitized by the Schmitt trigger unit 12, a broad high level "1" i.e., a long duty cycle, is obtained. Accordingly, analog signals are converted into digital signals based on the relationship between the duty cycle and the amplitude to facilitate the subsequent data processing and analysis.

Figure 4A:
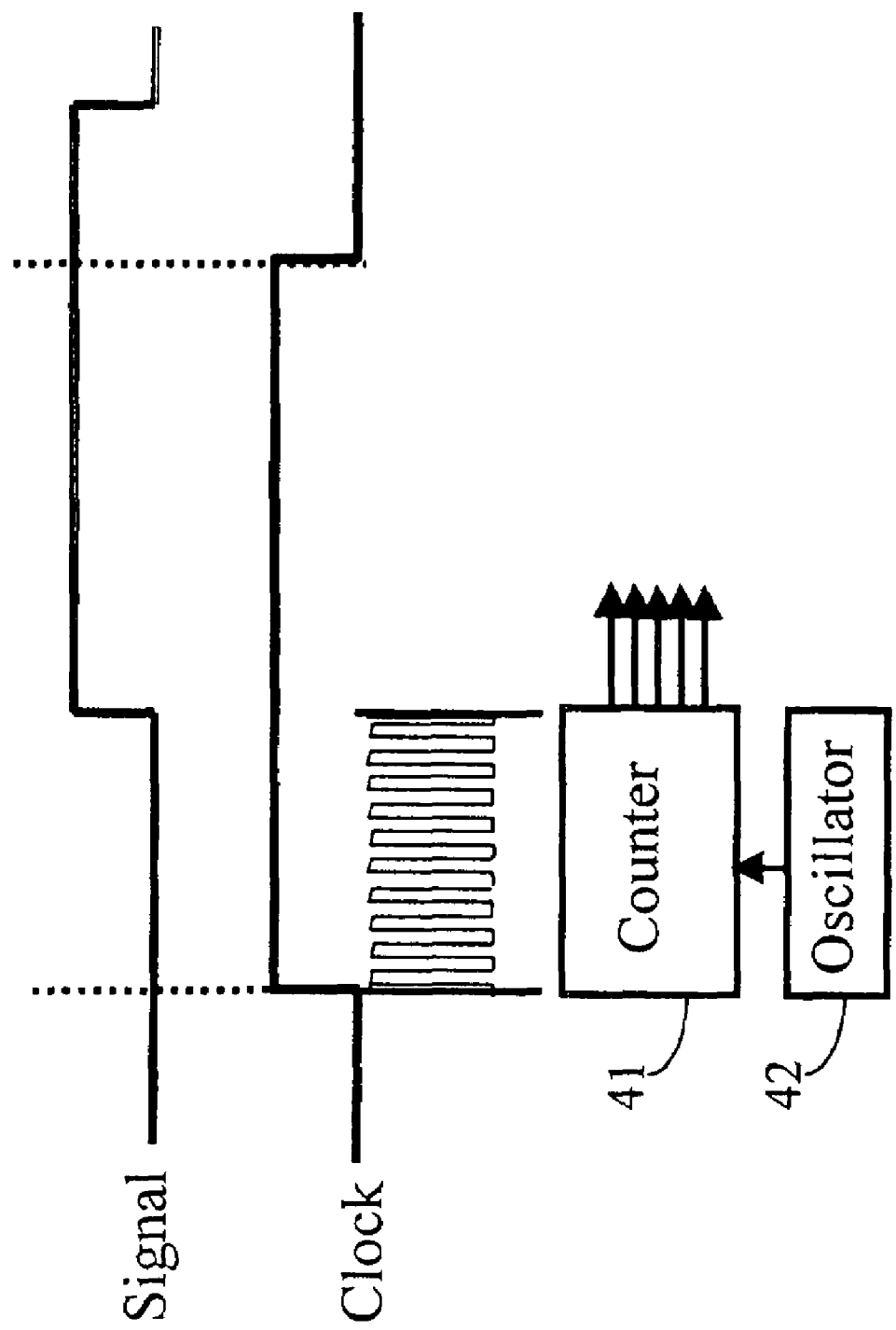
FIG. 4(a) and FIG. 4(b) exemplify ways of calculating the duty cycles as put forth in a BIST apparatus in accordance with the present invention.
Figure 4B:
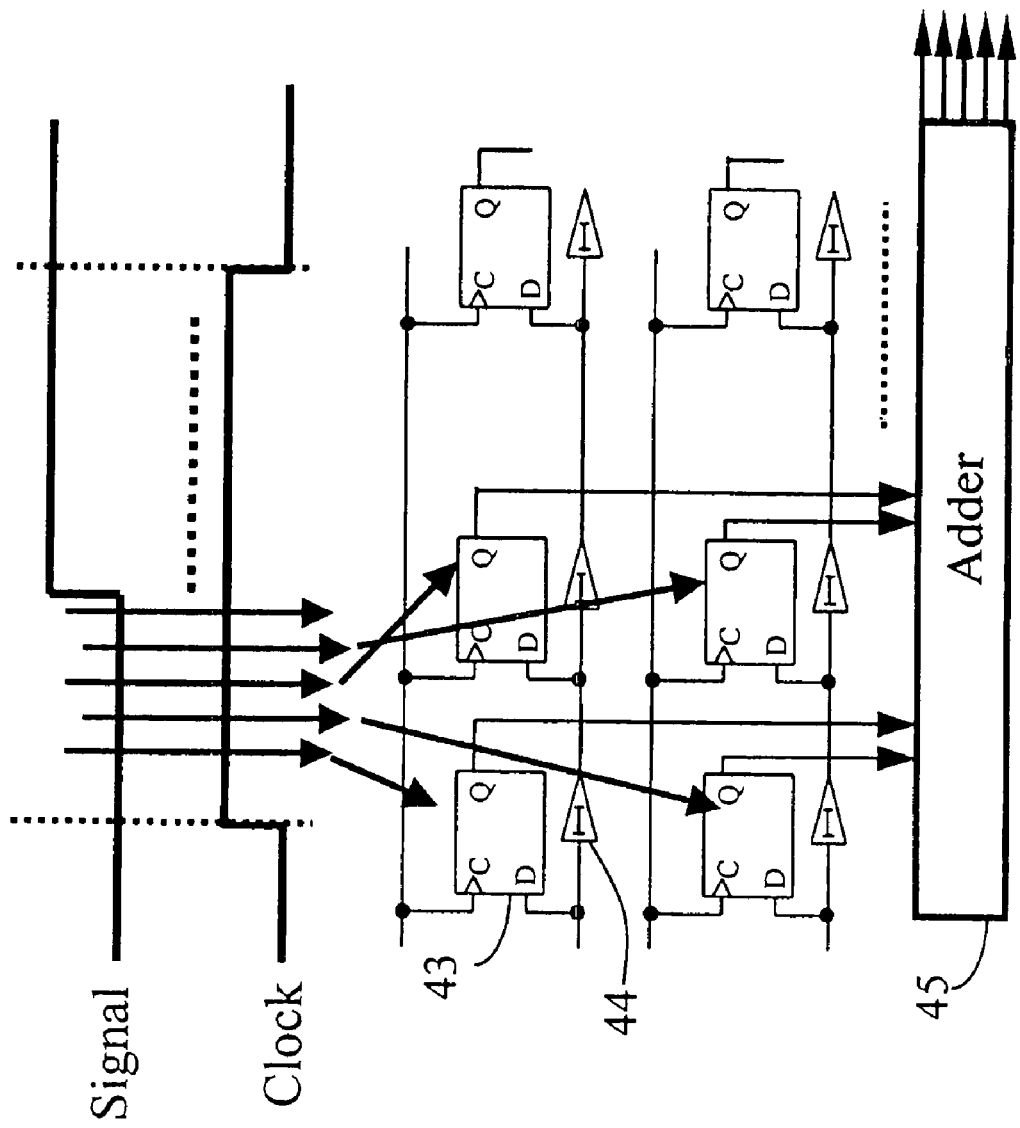

FIG. 4(a) and FIG. 4(b) illustrate the operation of the duty cycle retriever 115 for being applied to low-speed signals and high-speed signals, respectively. As shown in FIG. 4(a), if a signal digitized by the Schmitt trigger unit 12 is transmitted at a low speed, e.g., 5-10 ns, a clock is provided as the criterion for temporal comparison, and then an oscillator, coupled with a counter 41, calculates the time the signal takes to stay at the low level "0" during the high-level period of the clock. Accordingly, the time the signal takes to stay at the low level "0" is subtracted from the high-level period of the clock to figure out the time the signal takes to stay at the high level "1". As shown in FIG. 4(b), if a signal digitized by the Schmitt trigger unit 12 is transmitted at a high speed, e.g., 0.1-5 ns, it is feasible to use delay line technique, e.g., employing flip-flops 43, buffers 44 and an adder 45, to calculate the time the signal takes to stay at the low level "0".

Figure 5:
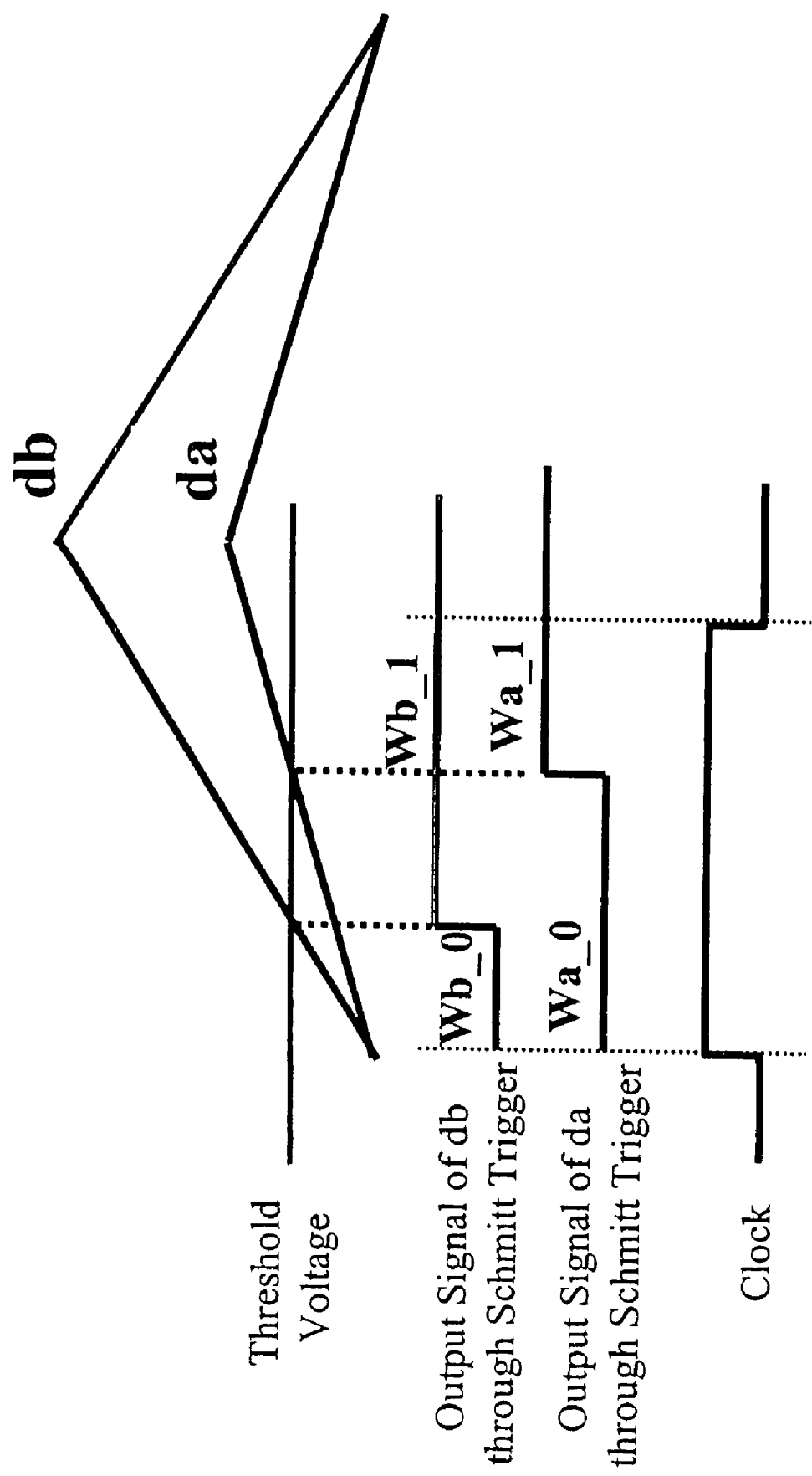
FIG. 5 illustrates a way of analyzing the duty cycles as put forth in a BIST apparatus in accordance with the present invention.

As shown in FIG. 5, da and db respectively denote two successive signal pulses that appear prior to the conversion carried out by the Schmitt trigger unit 12. During the high-level period of a clock, the low level "0" duration and the high level "1" duration of the signal converted from signal db are denoted by Wb_0 and Wb_1, respectively. Similarly, Wa_1 and Wa_0 denote the high level "1" duration and the low level "0" duration of the signal converted from da, respectively. In practice, the signal db can be deduced from the preceding signal da, and the expression is as follows: db=da×(Wb_0+(Wb_1−Wa_1))/Wb_0. Then, differential non-linearity (DNL) is calculated based on db, that is, by subtracting the least significant bit (LSB) from db, i.e., DNL=db−LSB. DNL represents the error between the LSB and the voltage that corresponds to the signal.

Table 1 shows a preferred embodiment of the present invention for the application to a 4-bit DAC, in which the code "1" represents "0000", and the code "2" represents "0001," and the remainders are defined in sequence by analogy. Since analysis is performed on successive codes in the BIST of the preferred embodiment, the LSB is 1.

TABLE 1

| Code | W x_0 | W x_1 | db | DNL |
| --- | --- | --- | --- | --- |
| 1 | 300 | 340 | 1 | 0 |
| 2 | 298 | 342 | 1.006711409 | 0.006711 |
| 3 | 293 | 347 | 1.023890785 | 0.023891 |
| 4 | 293 | 347 | 1.023897085 | 0.023891 |
| 5 | 292 | 348 | 1.02739726 | 0.027397 |
| 6 | 296 | 344 | 1.013513514 | 0.013514 |
| 7 | 399 | 241 | 0.751879699 | −0.24812 |
| 8 | 242 | 398 | 1.239669421 | 0.239669 |
| 9 | 299 | 341 | 1.003344482 | 0.003344 |
| 10 | 286 | 354 | 1.048951049 | 0.048951 |
| 11 | 243 | 397 | 1.234567901 | 0.234568 |
| 12 | 396 | 244 | 0.757575758 | −0.24242 |
| 13 | 296 | 344 | 1.013513514 | 0.013514 |
| 14 | 295 | 345 | 1.016949153 | 0.016949 |
| 15 | 300 | 340 | 1 | 0 | x is a or b

Figure 6:
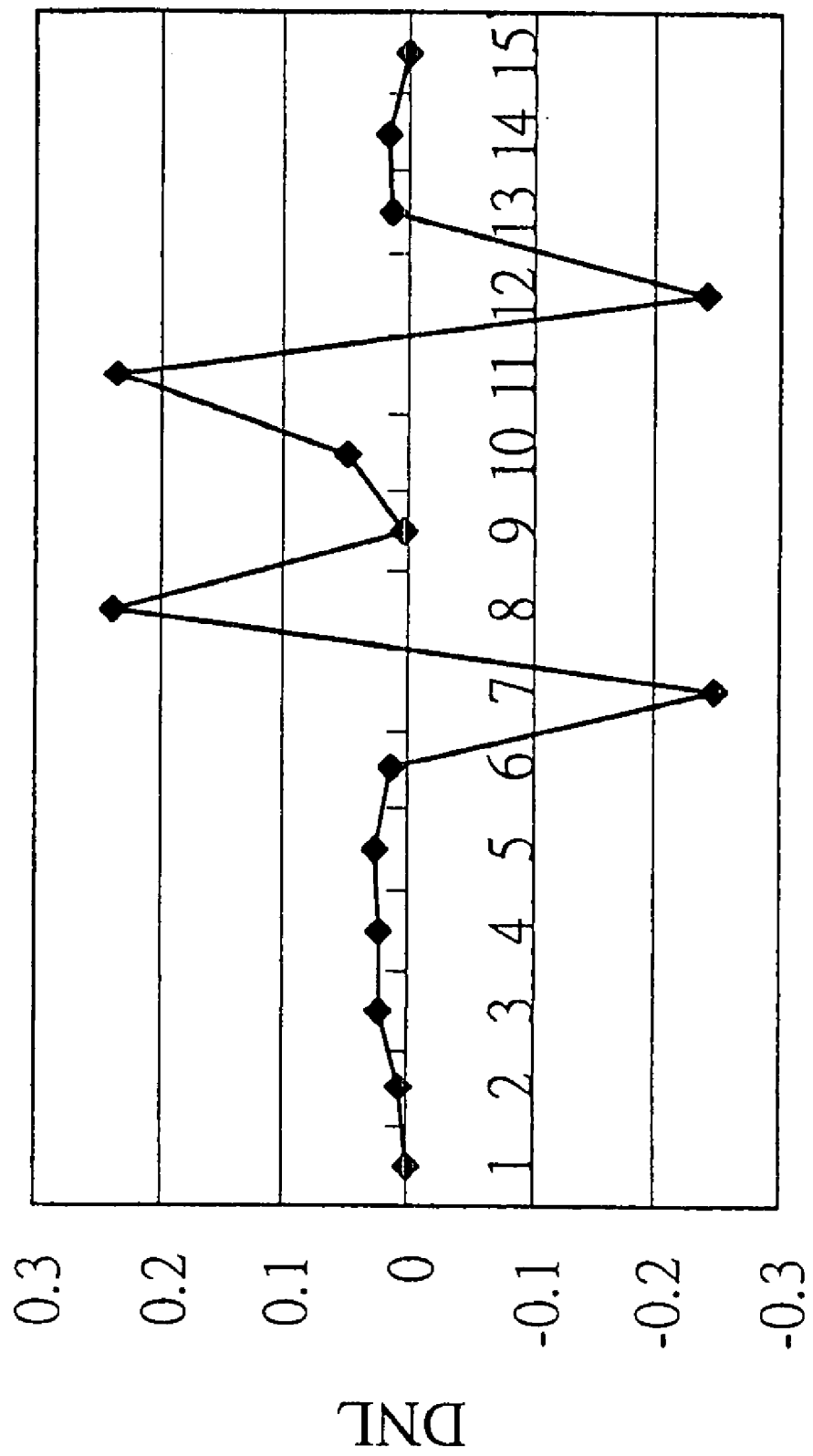
FIG. 6 illustrates a test result as put forth in a BIST apparatus in accordance with the present invention.

FIG. 6 is the curve diagram showing the preferred embodiment illustrated in Table 1. The DNL corresponding to the code "7" is approximately −0.2, obviously deviating from a LSB. In other words, the code "7" is in fact only approximately 6.8 and, in consequence, the distance between the codes "7" and "8" increases to 1.2. This happens to the codes "11" and "12" as well. Accordingly, it is believed that the errors of the code "7" and the code "11" are too large, and thus the circuit has to be corrected and compensated for.

Figure 7:
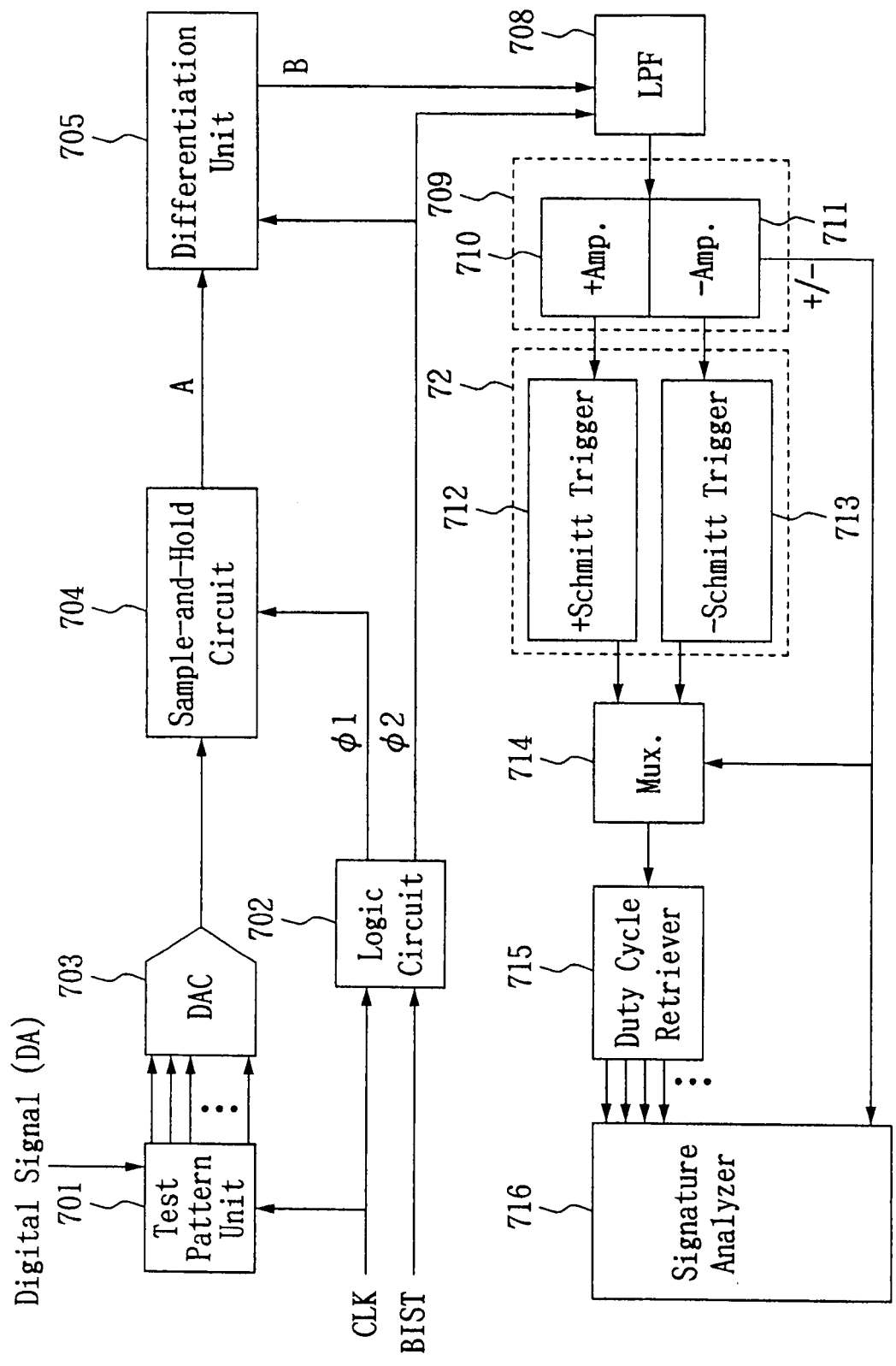
FIG. 7 illustrates another BIST apparatus applied to a DAC in accordance with the present invention.

The signal selection circuit 11, the summer 117 and the first LPF 118 can be substituted for another circuitry for processing high-speed DA signals. As shown in FIG. 7, a BIST apparatus 70 for a DAC 703 includes a test pattern unit 701, a logic circuit 702, a sample-and-hold circuit 704, a differentiation unit 705, an LPF 708, an amplification unit 709, a Schmitt trigger unit 72, a multiplexer 714, a duty cycle retriever 715 and a signature analyzer 716, where the amplification unit 709 includes a positive amplifier 710 and a negative amplifier 711, and the Schmitt trigger unit 72 includes a positive Schmitt trigger 712 and a negative Schmitt amplifier 713 in parallel, and the positive Schmitt trigger 712 and the negative Schmitt trigger 713 are coupled to the positive amplifier 710 and the negative amplifier 711, respectively. A clock signal CLK transmitted to the test pattern unit 701 and the logic circuit 702 has the same speed as the circuit for being tested, i.e., the speed of inputting DA signals into the DAC 703. The BIST signal transmitted into the logic circuit 702 is employed to trigger the apparatus 70 into a BIST mode, i.e., the signal BIST is at high level.

Figure 8:
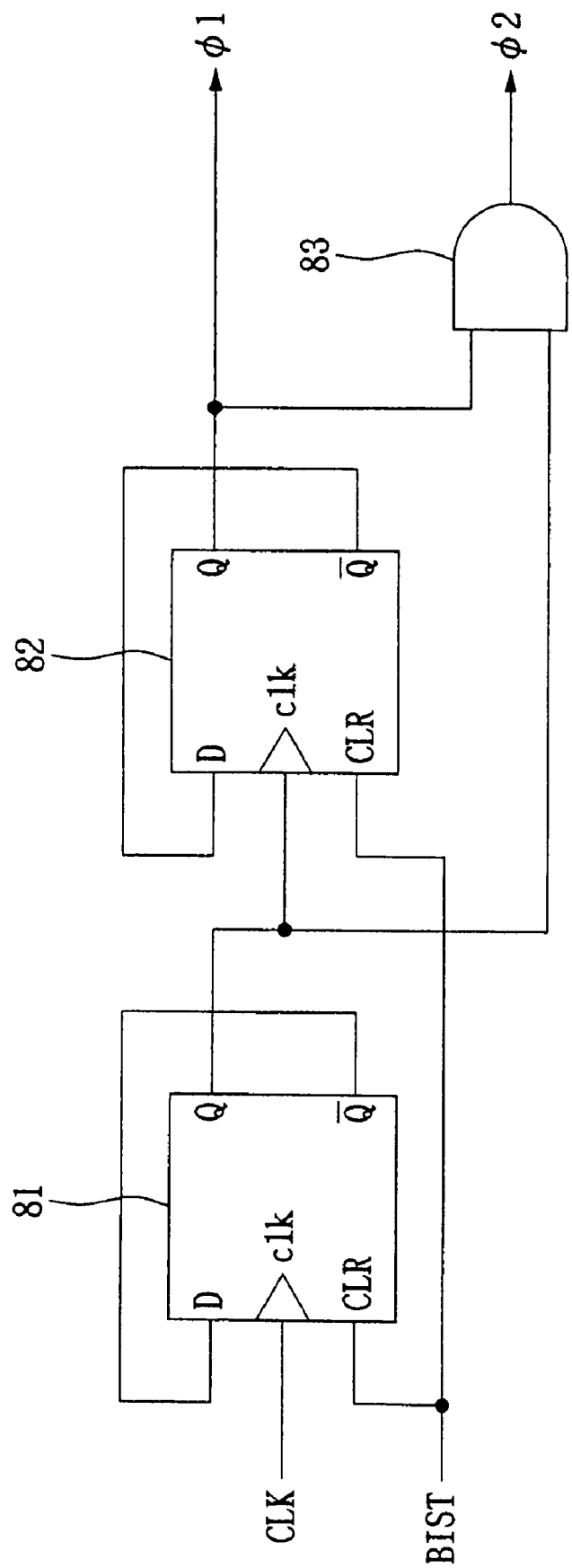
FIG. 8 exemplifies a schematic diagram of the logic circuit shown in FIG. 7.

FIG. 8 exemplifies a schematic diagram of the logic circuit 702 which is used for down-converting a frequency to be one-quarter thereof, in which the logic circuit 702 comprises two flip-flops 81, 82 and an AND gate 83 whereby control signals $\phi 1$ and $\phi 2$ are generated. The signal $\phi 1$ is transmitted to the sample-and-hold circuit 704, whereas the signal $\phi 2$ is transmitted to the differentiation unit 705 and the LPF 708. Consequently, the logic circuit 702 makes the DAC 703 and sample-and-hold circuit 704 process at high speed, whereas the devices disposed thereafter process at low speed. The multiple of the difference of the high and low speeds can be controlled by adjusting the logic circuit 702.

Figure 9:
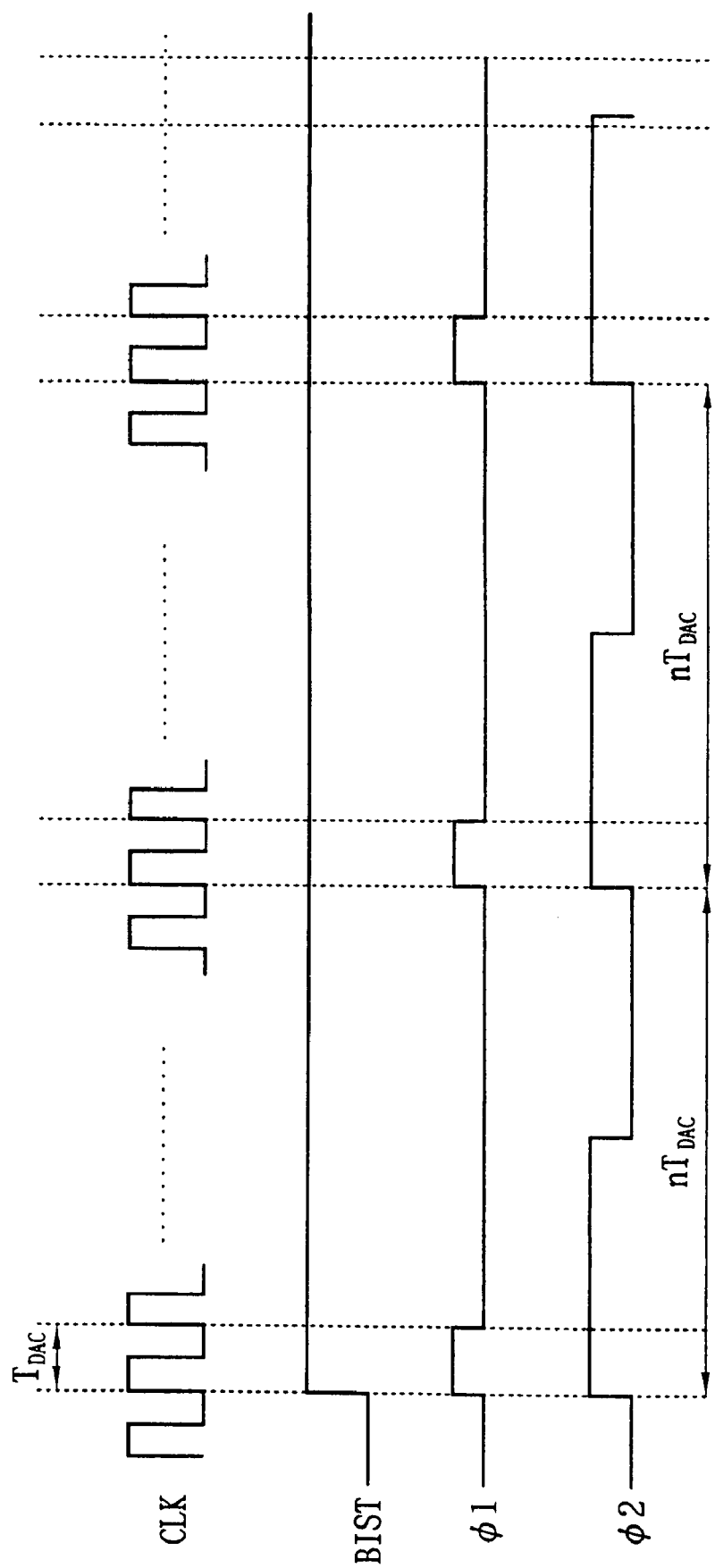
FIG. 9 illustrates the control signals output from the logic circuit in relation to a clock signal and a BIST signal with respect to a BIST apparatus in accordance with the present invention.
Figure 10:
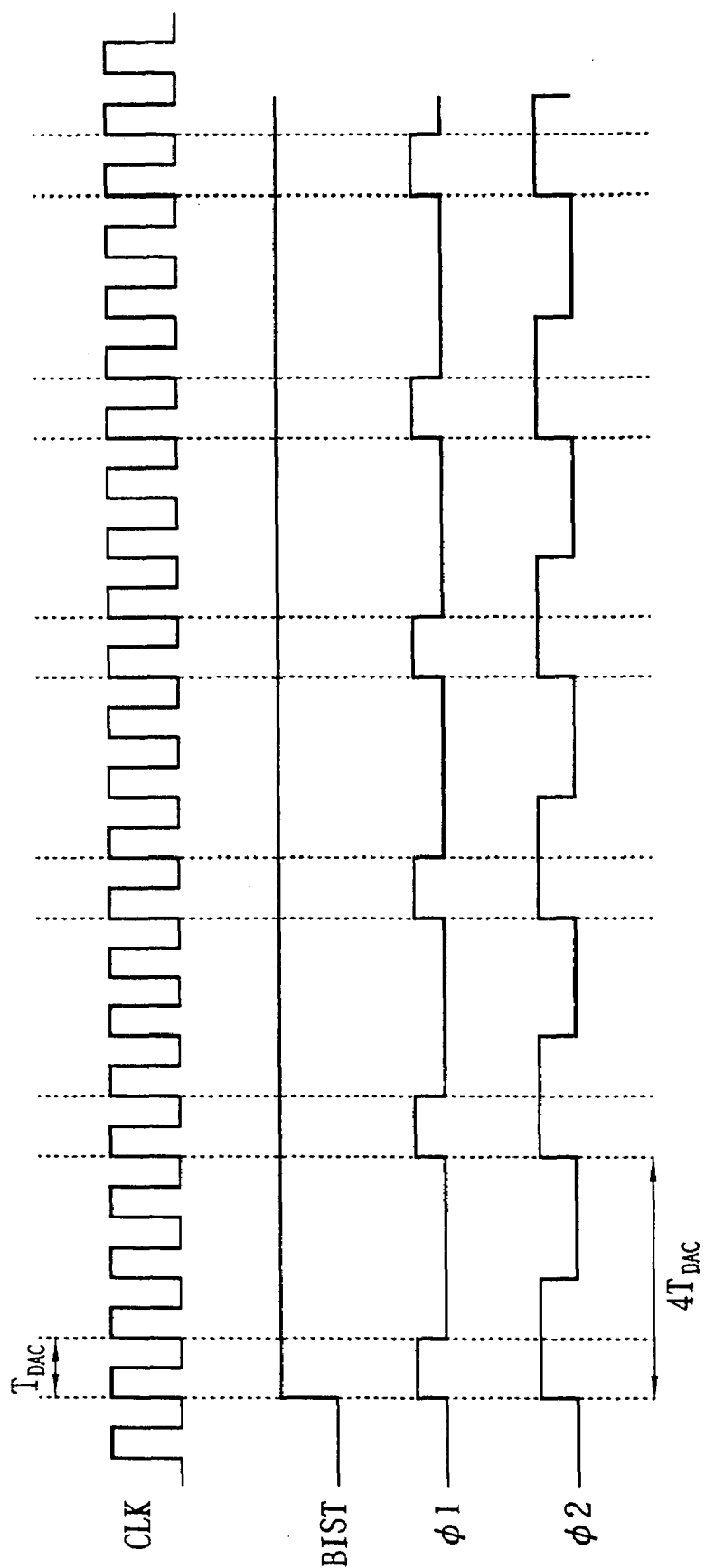
FIG. 10 illustrates the control signals output from the logic circuit for the case of quarter speed lower than DAC with respect to a BIST apparatus in accordance with the present invention.

As shown in FIG. 9, owing to having the same speed as that of the DA signals input into the DAC 703, the period $T_{DAC}$ of the CLK is equal to the time for sampling a DA signal. Whenever the signal BIST switches to high level, the apparatus 70 is in a BIST mode. The time period of the control signal $\phi 1$ at high level is equal to the $T_{DAC}$, whereas the $\phi 2$ has a duty cycle of 50%. The periods of the signals $\phi 1$ and $\phi 2$ are dependent on the multiple of the frequency down-conversion. If the frequency of the high speed is "n" times that of the low speed, the periods of the signals $\phi 1$ and $\phi 2$ are $nT_{DAC}$. For instance, if the frequency of the high speed is four times that of the low speed, the periods of the $\phi 1$ and $\phi 2$ are equal to $4T_{DAC}$ as shown in FIG. 10.

Figure 11:
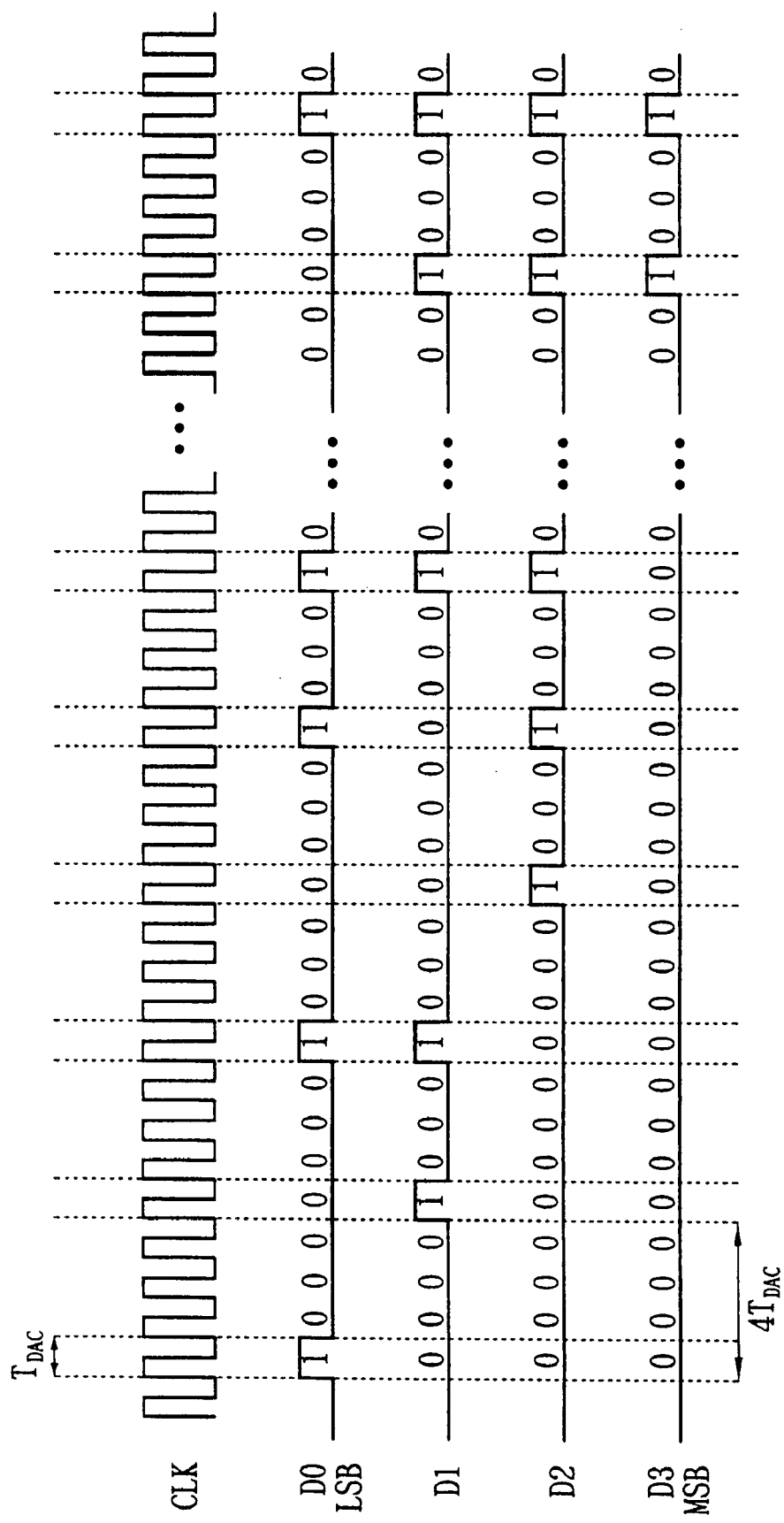
FIG. 11 illustrates a test pattern of a BIST apparatus in accordance with the present invention.

FIG. 11 shows the namely return-to-zero test pattern of 4-bit generated by the test pattern unit 701. There are four bit signals D0, D1, D2, D3 standing for DA digital input signals, wherein the D0 is the least significant bit (LSB), and the D3 is the most significant bit (MSB). For example, D3, D2, D1, and D0 are respectively equal to 0, 0, 0, and 1 for the DA signal "0001," and 1, 1, 1, and 1 for the signal "1111." Whenever signal $\phi 1$ is at high level in the presence of a CLK cycle, incremental signals "0001", "0010" . . . "1111" are input. Whenever signal $\phi 1$ is at low level in the presence of a CLK cycle, "0" is input. The number of "0" is equal to that of subtracting one from the multiple of the frequency of the high speed to that of the low speed. Consequently, D3, D2, D1 and D0 are all assigned to "0" between the adjacent DA input signals, e.g., D3, D2, D1 and D0 are all "0" between "0001" and "0010." In other words, the D3, D2, D1 and D0 are returned to zero whenever there is no DA input signal.

Figure 12:
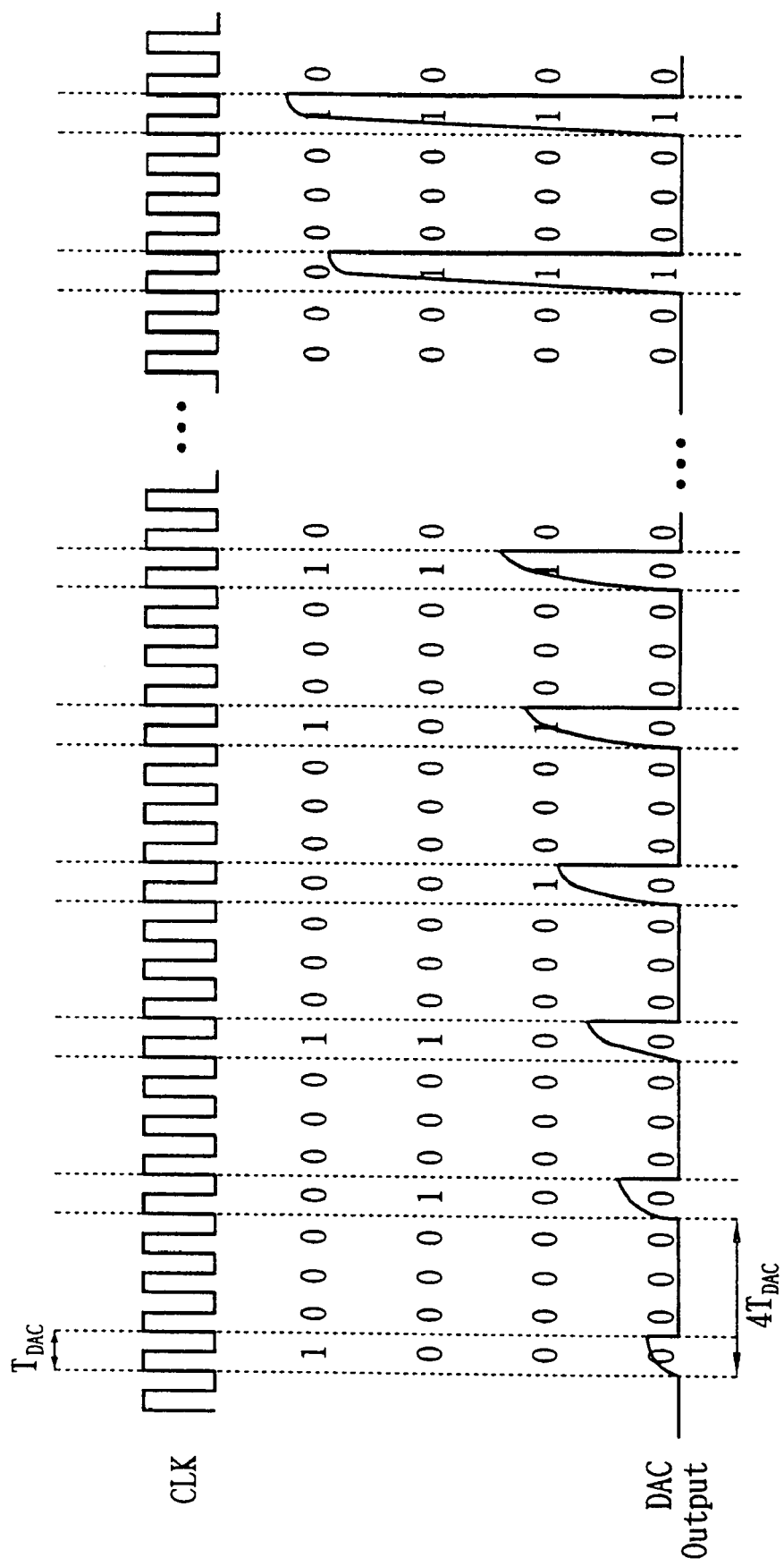
FIG. 12 illustrates an output signal from the DAC of a BIST apparatus in accordance with the present invention.

The bit signals D3, D2, D1 and D0 are transmitted into the DAC 703, and the output signal from the DAC 703 is shown in FIG. 12. The DAC output signal ramps up during the time period having DA signal and returns to zero for the other clock pulses. The heights of the pulses of the DAC output signal are incremental by one pulse after another. Accordingly, the speed of the DAC output signal is one-quarter of that of the CLK, i.e., the speed of the DA signal can slow down, so that it is suitable to process high-speed DA signals. If the frequency of the high speed is eight times that of the low speed, the speed of the CLK is eight times that of the DAC output signal. As a result, DAC is manipulated under a normal speed, whereas the testing circuit can be manipulated under a relatively low speed.

Figure 13:
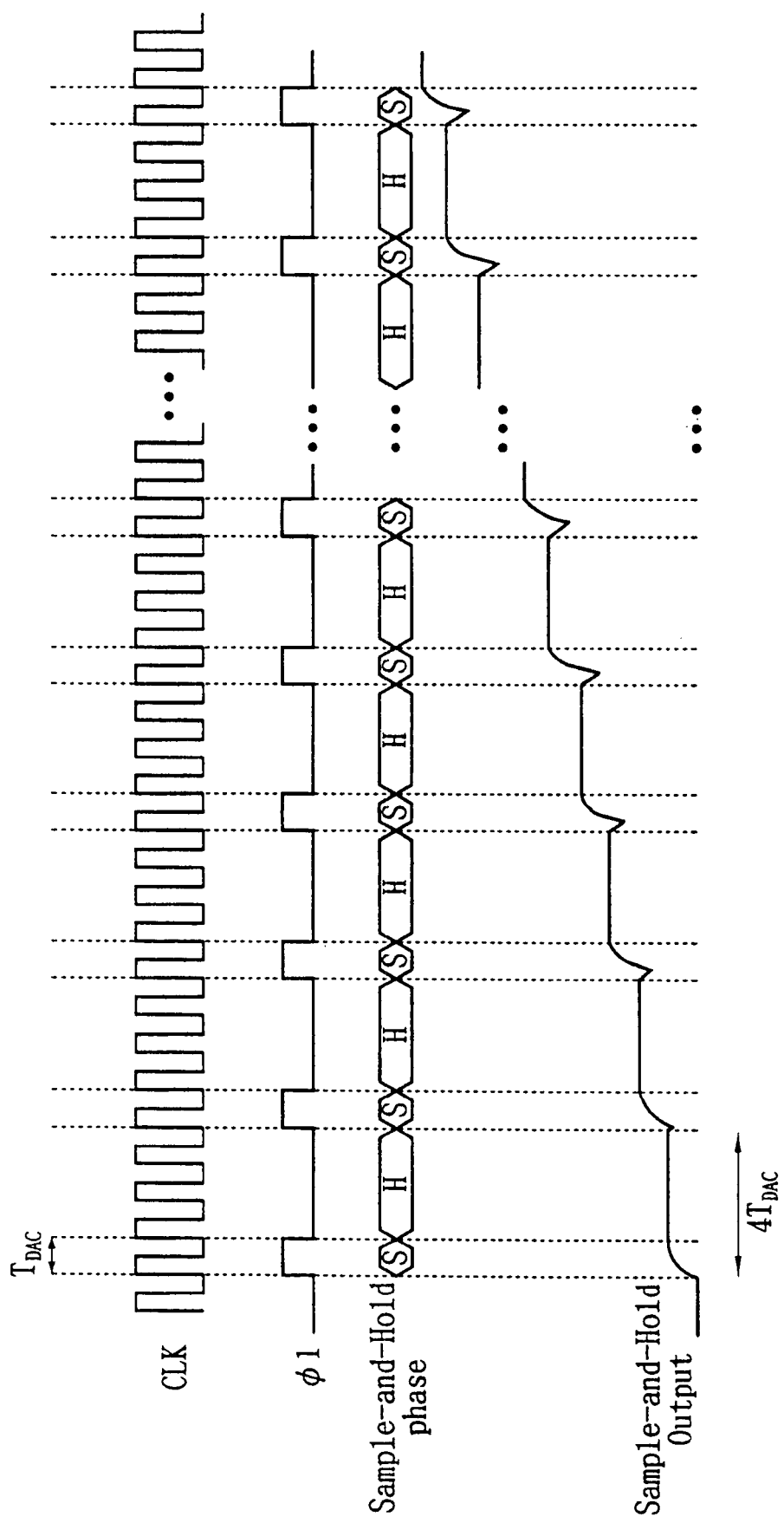
FIG. 13 illustrates an output signal from the sample-and-hold circuit of a BIST apparatus in accordance with the present invention.

As shown in FIG. 13, the DAC output signal is transmitted into the sample-and-hold circuit 704 for being sampled and retained the peak values of the pulses of the DAC output signal in the light of the signal φ 1. Whenever the signal φ 1 is at high level, the DAC output signal is being sampled, otherwise the peak value of the DAC output signal is retained. In FIG. 13, sampling period is denoted by "S," and holding period is denoted by "H" in the sample-and-hold phases, in which "S" corresponds to the time φ 1 at high level, and "H" corresponds to the time φ 1 at low level, thereby a substantially incremental and continuous sample-and-hold output signal is generated.

Figure 14:
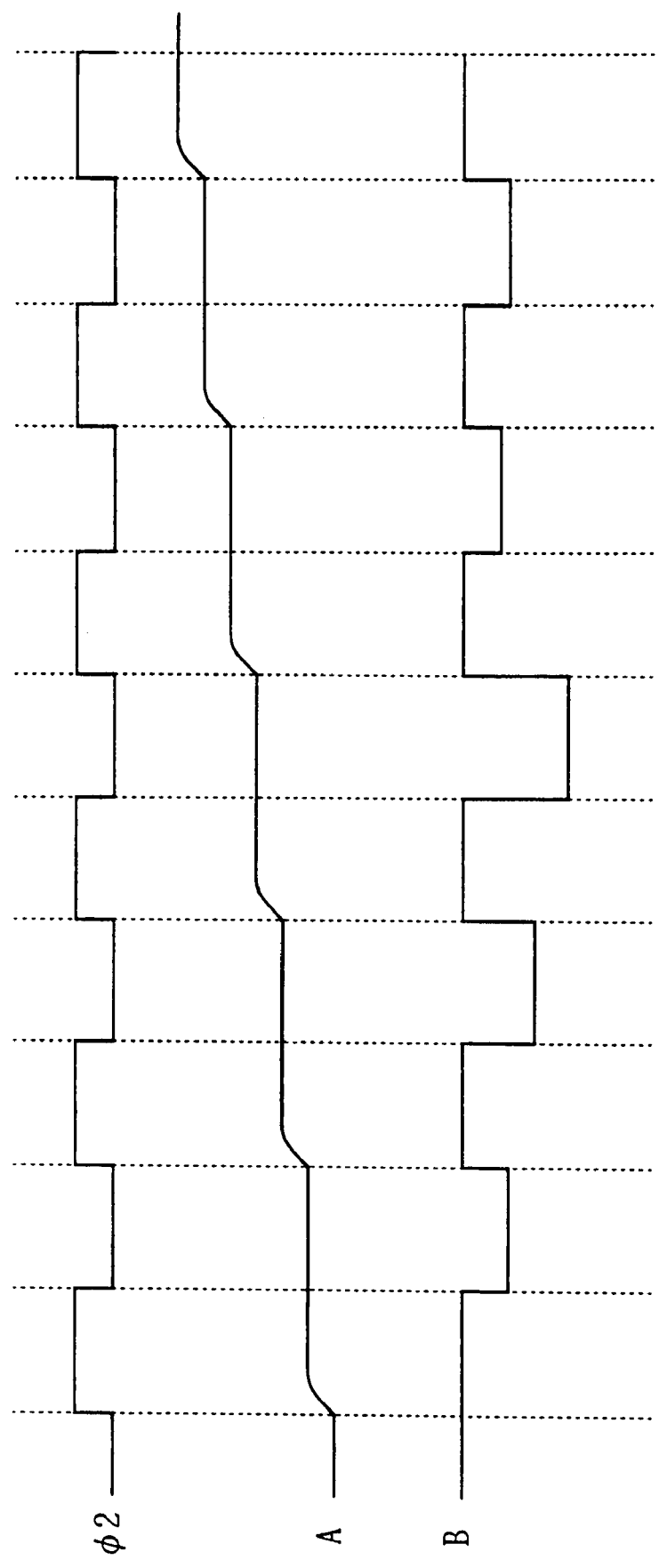
FIG. 14 illustrates signals before and after the differentiation unit of a BIST apparatus in accordance with the present invention.

The differentiation unit 705, the LPF 708, the amplification unit 709, the Schmitt trigger unit 72, the multiplexer 714, the duty cycle retriever 715 and the signature analyzer 716 are essentially equivalent to the differentiation unit 107, the second LPF 108, the amplification unit 109, the Schmitt trigger 12, the second multiplexer 114, the duty cycle retriever 115 and the signature analyzer 116, respectively. For example, in FIG. 14, a sample-and-hold output signal "A" will be transformed into a signal "B" through the differentiation unit 705; they are with reference to the positions "A" and "B" shown in FIG. 7, respectively. The signal "B" shows the difference between individual pulses of the signal "A." The conversion done by the differentiation unit 705 is essentially the same as that done by the differentiation unit 105, and the sequential process starting from here is the same as or similar to the process mentioned above, so that the relevant description is omitted therein.

The present invention does not involve processing DA signals directly. Instead, it is intended to identify the difference between two successive pulses of a signal by differentiation technique, and it converts the amplitude of the signal that stands for the difference into the duty cycle of a digital signal so as to analyze the error of successive codes, with a view to minimizing the complexity and difficulty in the BIST apparatus and method applied to a DAC.

The above-described embodiments of the present invention are intended to be illustrative only. Numerous alternative embodiments may be devised by those skilled in the art without departing from the scope of the following claims.

What is claimed is:

1. A built-in self-test apparatus for a digital-to-analog converter, comprising:
    a first low-pass filter for smoothening analog signals output from a digital-to-analog converter;
    a differentiation unit for differentiating output signals of the first low-pass filter;
    a second low-pass filter for smoothening output signals of the differentiation unit;
    a Schmitt trigger unit for converting output signals of the second low-pass filter into digital signals;
    a duty cycle retriever for calculating duty cycles of the digital signals; and
    a signature analyzer for performing an error analysis based on the duty cycles.

2. The built-in self-test apparatus for a digital-to-analog converter in accordance with claim 1, further comprising:
    a signal selection circuit comprising a calibration circuit and a testing circuit that are connected in parallel for calibrating or testing input signals, wherein the testing circuit comprises the digital-to-analog converter; and
    a summer for combining output signals of the calibration circuit and the testing circuit, wherein the input end of the summer is connected to the output end of the signal selection circuit and the output end of the summer is connected to the first low-pass filter.

3. The built-in self-test apparatus for a digital-to-analog converter in accordance with claim 2, wherein the signal selection circuit further comprises a counter.

4. The built-in self-test apparatus for a digital-to-analog converter in accordance with claim 2, wherein the signal selection circuit further comprises a multiplexer for selecting the calibration circuit or the testing circuit.

5. The built-in self-test apparatus for a digital-to-analog converter in accordance with claim 1, further comprising an amplification unit disposed between the Schmitt trigger unit and the second low-pass filter for amplifying output signals of the second low-pass filter.

6. The built-in self-test apparatus for a digital-to-analog converter in accordance with claim 5, wherein the amplification unit comprises a positive amplifier and a negative amplifier that are connected in parallel.

7. The built-in self-test apparatus for a digital-to-analog converter in accordance with claim 1, further comprising a multiplexer disposed between the Schmitt trigger unit and the duty cycle retriever.

8. The built-in self-test apparatus for a digital-to-analog converter in accordance with claim 1, wherein the Schmitt trigger unit is constituted of a positive Schmitt trigger and a negative Schmitt trigger that are connected in parallel.

9. The built-in self-test apparatus for a digital-to-analog converter in accordance with claim 1, wherein the differentiation unit is selected from one of a differentiator, a sample-and-hold circuit and a switching capacitor circuit.

10. The built-in self-test apparatus for a digital-to-analog converter in accordance with claim 1, wherein the duty cycle retriever comprises a counter and an oscillator.

11. The built-in self-test apparatus for a digital-to-analog converter in accordance with claim 1, wherein the duty cycle retriever comprises a plurality of flip-flops, a plurality of buffers and an adder.

12. A built-in self-test apparatus for a digital-to-analog converter, comprising:
    a test pattern unit connected to a digital-to-analog converter under test for generating a test pattern including a plurality of bit signals, wherein the test pattern is an association of digital-to-analog (DA) signals of the digital-to-analog converter;
    a sample-and-hold circuit for sampling and holding output signals of the digital-to-analog converter;
    a differentiation unit for differentiating output signals of the sample-and-hold circuit;

a low-pass filter for smoothening output signals of the differentiation unit;

a Schmitt trigger unit for converting output signals of the low-pass filter into digital signals;

a duty cycle retriever for calculating duty cycles of the digital signals; and a signature analyzer for performing an error analysis based on the duty cycles.

13. The built-in self-test apparatus for a digital-to-analog converter in accordance with claim 12, wherein the bit signals between two adjacent DA signals are equal to zero.

14. The built-in self-test apparatus for a digital-to-analog converter in accordance with claim 12, wherein the frequency of inputting DA signals is a multiple of the frequency of output pulse signals of the digital-to-analog converter.

15. The built-in self-test apparatus for a digital-to-analog converter in accordance with claim 14, wherein the multiple is equal to the number of bits of the DA signals.

16. The built-in self-test apparatus for a digital-to-analog converter in accordance with claim 12, further comprising a logic circuit for providing control signals to the sample-and-hold circuit.

17. The built-in self-test apparatus for a digital-to-analog converter in accordance with claim 16, wherein the logic circuit further provides control signals for the differentiation unit.

18. The built-in self-test apparatus for a digital-to-analog converter in accordance with claim 16, wherein the logic circuit comprises two flip-flops and an AND gate.

19. A built-in self-test method for a digital-to-analog converter, comprising the steps of:

converting a digital signal into an analog signal;

smoothening the analog signal for the first time to remove noise;

differentiating the analog signal smoothened for the first time to obtain the differences between pulses of the analog signal;

smoothening the analog signal for the second time;

converting the analog signal into a digital signal in the light of a threshold voltage;

calculating a duty cycle of the digital signal; and calculating an error of the analog signal based on the duty cycle.

20. The built-in self-test method for a digital-to-analog converter in accordance with claim 19, wherein the error is calculated based on differential non-linearity.

21. The built-in self-test method for a digital-to-analog converter in accordance with claim 19, further comprising the step of amplifying the analog signal smoothened for the second time.

22. The built-in self-test method for a digital-to-analog converter in accordance with claim 19, wherein the analog signal is smoothened for the first time and the second time by a low-pass filter.

23. The built-in self-test method for a digital-to-analog converter in accordance with claim 19, wherein the analog signal is differentiated by one of a differentiator, a sample-and-hold circuit and a switching capacitor circuit.

24. The built-in self-test method for a digital-to-analog converter in accordance with claim 19, wherein the duty cycle is calculated by one of a counter and a delay line.

25. A built-in self-test method for a digital-to-analog converter, comprising the steps of:

generating a test pattern including a plurality of bit signals, wherein the test pattern is an association of digital-to-analog (DA) signals of the digital-to-analog converter;

converting the bit signals into an analog signal;

performing sample-and-hold to the analog signal, wherein pulses of the analog signal are sampled and peak values of the pulses of the analog signal are held;

differentiating the analog signal being sampled and held to verify differences between the pulses thereof;

smoothening the analog signal;

converting the analog signal into a digital signal in the light of a threshold voltage;

calculating a duty cycle of the digital signal; and calculating an error of the analog signal based on the duty cycle.

26. The built-in self-test method for a digital-to-analog converter in accordance with claim 25, wherein bit signals between two adjacent DA signals are equal to zero.

27. The built-in self-test method for a digital-to-analog converter in accordance with claim 25, wherein the frequency of inputting DA signals is a multiple of the frequency of output pulse signals of the digital-to-analog converter.

28. The built-in self-test method for a digital-to-analog converter in accordance with claim 27, wherein the multiple is equal to the number of bits of the DA signals.

* * * * *